United States Patent [19]

Worsham et al.

[11] 4,251,772
[45] Feb. 17, 1981

[54] PROBE HEAD FOR AN AUTOMATIC SEMICONDUCTIVE WAFER PROBER

[75] Inventors: Daniel A. Worsham, San Jose; Jack E. Ashley, Cupertino; Joseph M. Munoz, San Jose, all of Calif.

[73] Assignee: Pacific Western Systems Inc., Mountain View, Calif.

[21] Appl. No.: 972,820

[22] Filed: Dec. 26, 1978

[51] Int. Cl.² ............... G01R 31/02; G01R 31/22
[52] U.S. Cl. ............................... 324/158 P; 324/72.5
[58] Field of Search ............... 324/158 P, 158 F, 72.5, 324/149

[56] References Cited

U.S. PATENT DOCUMENTS

| 3,939,414 | 2/1976 | Roch | 324/158 P |
| 4,056,777 | 11/1977 | Roch | 324/158 P |

OTHER PUBLICATIONS

Wagner et al., "Orbiting Probe", IBM Tech. Dis. Bull., vol. 13, No. 7, Dec. 1970, pp. 2113-2114.

Primary Examiner—Ernest F. Karlsen
Attorney, Agent, or Firm—Harry E. Aine; Harvey G. Lowhurst

[57] ABSTRACT

In a probe head for an automatic semiconductive wafer prober, the probe head includes a probe body means for coupling the probe head to the probe holder surrounding a chuck which carries the wafer. The chuck is moveable in the plane of the wafer (horizontal) and orthogonal to the plane of the wafer (vertical) for sequentially moving a pattern of probe heads into testing engagement with corresponding patterns of test points on the wafer under test. The probe head includes a testing head having a probe portion (blade, needle or point) for making electrical contact with a respective test point on the wafer. The test head is coupled to the probe body by means of a way for guiding the initial vertical adjustable movement of the testing head in the vertical direction, whereas the probe body is pivotably and slideably coupled to the probe holder so as to permit a second initial adjustment of the probe body in the horizontal plane for establishing the test probe pattern. Removable pry means are provided for independently adjusting both the horizontal and the vertical setting of the probe head relative to the probe holder. The test head includes a blade shaped probe portion having plurality of test points thereon such that rotation of the probe blade in its holder allows a new replacement point to be brought into operative use.

4 Claims, 2 Drawing Figures

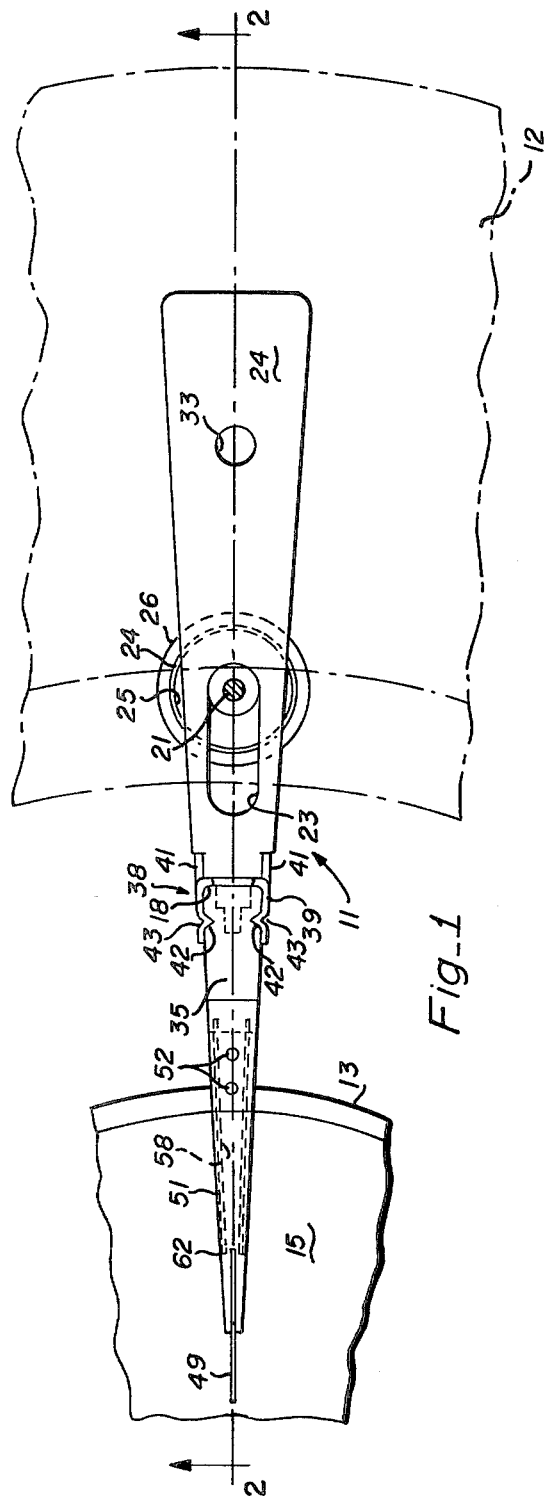
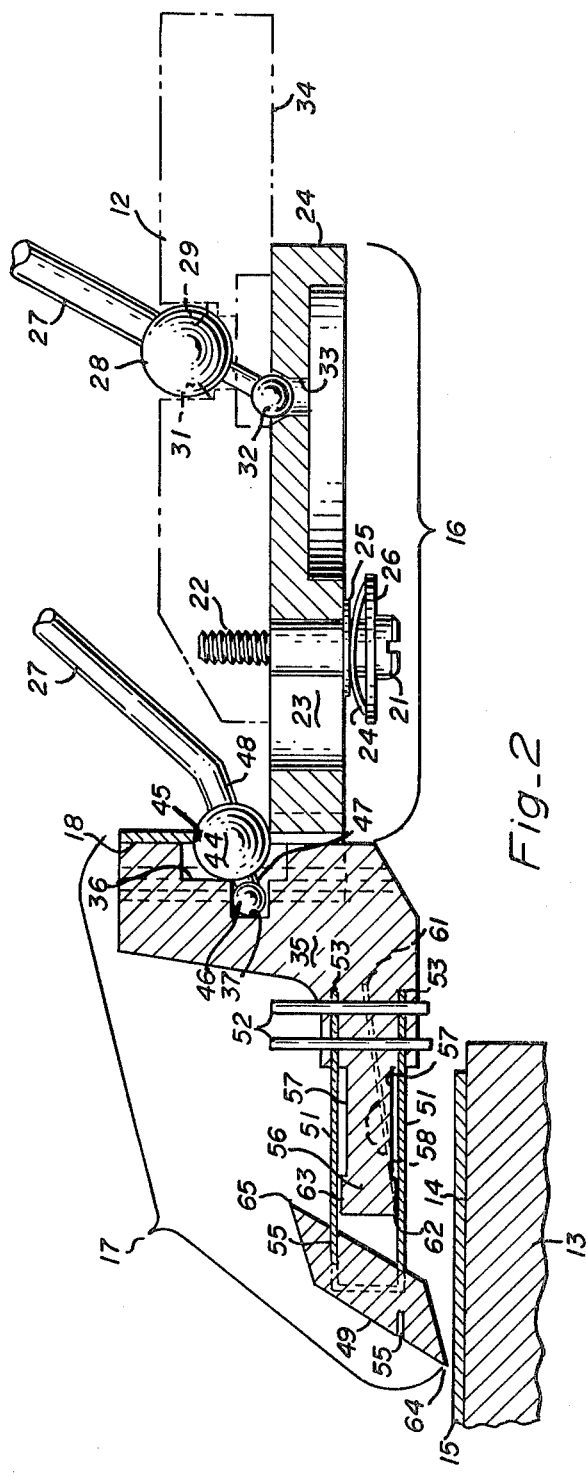

PROBE HEAD FOR AN AUTOMATIC SEMICONDUCTIVE WAFER PROBER

BACKGROUND OF THE INVENTION

The present invention relates in general to probe heads for automatic semiconductive wafer probers and, more particularly, to an improved probe head having independent vertical and horizontal adjustment.

DESCRIPTION OF THE PRIOR ART

Heretofore, automatic semiconductive wafer probers have included a plurality of probe heads which are mounted to a probe holder surrounding a chuck. The chuck has a horizontal surface which holds the wafer under test and the plurality of probe heads, as carried from the surrounding probe holder, are adjusted in both the horizontal and vertical plane to certain predetermined patterns corresponding to the pattern of test points on the wafer under test. The test points on the wafer under test may comprise, for example, several points for each of the integrated circuit elements, such as 400 per wafer, and the chuck is moveable in incremental steps in orthogonal directions in the horizontal plane so as to advance successive patterns of test points on the respective integrated circuits into position under the corresponding pattern of probe heads. The chuck then moves vertically to bring the probe portions of the pattern of probe heads into electrical contact with the respective pattern of test points on the wafer under test.

The prior art probe heads included a joy stick type pry means fixedly coupled to each probe head for prying the respective probe head relative to the probe holder in both X and Y orthogonal directions in the horizontal plane so as to establish the horizontal position of the probe contact portion of each probe head relative to the desired pattern of test points. A vertical screw adjustment was provided on each probe head for pivoting the probe head relative to the probe holder so as to adjust the vertical position of the respective probe head.

The problem with these prior art probe heads, utilizing the pivoting action to make the vertical adjustment, is that when the vertical adjustment is effected it also produces a slight change in the horizontal adjustment due to the pivoting action of the vertical adjustment. Thus, it is desired to obtain a probe head which is independently adjustable in both the vertical and horizontal directions so that adjustment of the vertical position of the probe head does not produce a corresponding change in the horizontal adjustment.

It is also known from the prior art to suspend the probe contact point on parallel springs to achieve a parallelogram suspension to assure true vertical contact engagement between the probe point and the test point on the wafer to reduce any wiping motion or scrubbing to a minimum.

Probe heads of the aforedescribed type are commercially available from Transistor Automation of Cambridge, Mass., as model XY-550 or model XY-555.

SUMMARY OF THE PRESENT INVENTION

The principal object of the present invention is the provision of an improved probe head for an automatic semiconductive wafer prober.

In one feature of the present invention, the probe head comprises a two-part structure including a probe body portion and a testing head portion with the testing head being carried from the body and the body being adjustable in the horizontal plane relative to the probe holder and with the testing head portion being adjustable in the vertical direction independent of the horizontal adjustment, whereby the horizontal and vertical adjustments are independent of each other.

In another feature of the present invention, the vertical adjustable movement of the testing head relative to the body of the probe head is guided by means of a vertically directed way to achieve independent vertical and horizontal adjustment.

In another feature of the present invention, the vertically directed way for guiding the vertical adjustment of the testing head portion is effected by means of a spring clip having a spring biased channel portion defining the way, whereby an inexpensive vertical guide of the test head relative to the body portion of the probe head is obtained.

In another feature of the present invention, a removeable pry means, such as a joy stick, is employed for effecting both the horizontal and vertical adjustments of the probe heads, whereby the cost and complexity of the probe head is reduced.

In another feature of the present invention, the probe portion of the probe head comprises a blade having a plurality of contact points thereon for contacting the test points on the wafer such that rotation of the blade from one point to another moves a new point of the blade into position for probing of the test point on the wafer under test.

In another feature of the present invention, a one piece leaf spring is formed into a parallelogram for spring suspension of the probe portion of the probe head, whereby the cost and complexity of the probe head is reduced.

Other features and advantages of the present invention will become apparent upon a perusal of the following specification taken in connection with the accompanying drawings wherein:

BRIEF DESCRIPTION OF THE DRAWINGS

FIG. 1 is a plan view of a probe head incorporating features of the present invention, and FIG. 2 is a sectional view of the structure of FIG. 1 taken along line 2—2 in the direction of the arrows.

DESCRIPTION OF THE PREFERRED EMBODIMENTS

Referring now to FIGS. 1 and 2 there is shown the probe head 11 incorporating features of the present invention. The probe head 11 constitutes one of a number of such probe heads 11 which are adjustably secured to an annular probe plate 12 which surrounds a chuck 13 having an upper planar surface 14 holding a semiconductive wafer 15 thereto, as by a vacuum.

Each of the individual probe heads 11 includes a body portion 16 and a test head portion 17. The test head portion 17 is coupled to the body portion 16 via the intermediary of a vertically directed way 18 so as to provide vertical adjustment of the probe head portion 17 relative to the body portion 16.

The body portion 16 is adjustably coupled to the annular probe holder plate 12 via the intermediary of a pivot screw 21 vertically threaded into a tapped bore 22 in the lower surface of the probe holder plate 12. The pivot screw 21 passes through an elongated slot 23 in a wedge-shaped main body member 24 of the probe body 16. The wedge-shaped member 24 is clamped to the bottom horizontal surface of the probe holder plate via the pivot screw 21 which clamps a spring washer 24 between a pair of washers 25 and 26, the latter washer 26 being captured by the head of the pivot screw 21.

The probe body portion 16 is moveable in the X and Y orthogonal directions in the horizontal plane relative to the probe holder plate 12 by means of a joy stick type pry lever tool 27. The pry lever tool 27 includes a fulcrum ball portion 28 which is inserted into a counter sunk bore 29 in the upper surface of the probe holder plate 12. The fulcrum ball bottoms on the internal shoulder 31 of the counter sunk bore 29 and a smaller pry ball portion 32 of the pry lever 27 projects downwardly from the fulcrum ball 28 through the bore 29 and rides within a flared entrance to a vertically directed bore 33 in the wedge shaped body member 25.

The pry lever 27 serves as a joy stick adjustment tool and is moveable in the X and Y directions so as to produce corresponding X and Y movements of the probe body 16 about the pivot screw 21. Since the lower surface 34 of the probe holder plate 35 is parallel with the horizontal plane, i.e., with the upper surface of the wafer 15, the probe body 16 with the attached head portion 17 moves strictly in the X-Y horizontal plane due to the adjustment effected through the bore 29 in the probe holder plate 12.

The testing head portion 17 of the probe head 11 includes a vertically directed slot 36 in the base of a wedge-shaped test head member 35 intersecting with a horizontal directed cylindrical bore 37. The vertically directed way 18, in a preferred example, comprises a spring clip 38. The spring clip 38 has a generally U-shaped channel portion 39 defining the vertically directed way 18 and a pair of horizontally directed tab portions 41 fixedly secured to the inner end of the wedge-shaped body member 24 of the probe body 16. A pair of vertically directed V-grooves 42 are provided in the test head member 35 and a pair of inwardly and vertically directed V-shaped detents 43 are formed in the sides of the channel member 38 for riding in the vertical grooves 42 of the wedge-shaped test head member 35.

Vertical adjustment of the test head portion 17 relative to the probe holder plate 12 and probe body portion 16 is effected by means of the removeable hand pry tool 27 which includes, at its second end, a second fulcrum ball 44 which is inserted through a circular opening 45 in the base of the channel clip 18. The inner end of the fulcrum ball 4 rests on the bottom of the vertical slot 36 in the test head member 35. A second pry ball 46 is carried from the second fulcrum ball 44 via a short lever arm 47. The pry ball 46 rides within the horizontal radial bore 37 in the test member 35. The second fulcrum ball 44 is carried from the pry lever 27 via a goose neck portion 48. Radial pivotable movement of the pry lever 27 produces a corresponding vertical adjustment of the test head portion 17 relative to the probe body 16 and the probe holder plate 12.

A generally parallelogram shaped point contact blade 49 is carried from and extends radially inwardly from the test head member 35 via the intermediary of a parallelogram type leaf spring structure 51. The lead spring 51 comprises a single leaf spring member formed into a generally U-shaped configuration which is pinned at the open end of the U-shaped spring 51 to the test head member 35 via vertically directed pins 52. The free ends of the U-shaped leaf spring 51 are apertured in alignment with the pins 52 and fit within horizontally directed slots 53 in the test head member 35. The other end of the leaf spring structure 51, namely the base portion, is longitudinally slotted at 54 to receive the blade 49 within the slot 54. The blade 49 is also slotted at 55 so that an unslotted portion of the leaf spring 51 may ride into the horizontal slot 55 in the blade 49. The blade is then soldered to the end of the leaf spring 51 to make a solid electrically conductive connection therebetween. The wedge-shaped test head member 35 includes a radially inwardly directed arm portion 56 which rides within the U-shaped leaf spring in vertically spaced relation therefrom, such arm 56 being further centrally recessed at 57 to accommodate vertical movement of the leaf spring 51.

A wire-shaped leaf spring 58 is affixed, at one end 59, to the test head 35 by snuggly fitting within a radially directed slot 61 in the test head member 35 and it rides at its other end 62 on the lower leaf spring member 51, for spring biasing the blade 49 toward the upper surface of the wafer 15 under test. The inner end of the arm portion 56 includes an upper lip portion 63 serving as stop for limiting the lowermost position of the blade 49.

The blade 49 includes two contact points 64 and 65. When one of the contact points, such as point 64, receives excessive wear or damage, the blade 49 is unsoldered from the leaf spring 51 and turned end-for-end and resoldered to the spring 51. In alternative embodiments, the blade may be triangular or other shaped to include more than two contact points 64 and 65.

The pins 52 make electrical contact to the blade 49 via the spring 51. The probe head member is made of an electrically insulative material such as Delrin plastic. Leads, not shown make electrical contact to the pins 52.

In operation, the operator, while observing through a microscope the position of the contact point 64 relative to a pattern of test points on the upper surface of the wafer 15 under test, inserts the pry tool 27 into bore 29 in the probe holder plate 12 and adjusts the X and Y position of the contact point 64 relative to the pattern of test points on the wafer to achieve the precise X-Y adjustment of the contact point 64 in the horizontal plane. Thereafter, the operator turns the pry tool end-for-end and inserts it into the recessed bore 37 in the test head 35 and pivots the outer end of the joy stick pry tool 27 radially for determining the proper vertical adjustment of the contact point relative to the wafer 15. This process is repeated for each of the probe heads 11 affixed to the probe holder plate 12. Once the individual probe heads 11 are adjusted to correspond with the individual test patterns, the automatic semiconductive prober machine is put into operation and the chuck 13 advances the next successive integrated circuit test pattern into position in the X-Y plane below the respective pattern of probe points 64. Then the chuck moves vertically to bring the test contact points 64 into probing contact with the pattern of test points on the wafer. An automatic wafer probe machine of this type is one commercially available from Pacific Western Systems, of Mountain View, Calif., as Model SP1-C.

The advantages of the probe head 11 of the present invention include:

Independent adjustment of the vertical and horizontal positions of the contact point 64 so that changes in the vertical position of the contact point do not result in undesired changes in the horizontal adjustment. Furthermore, the single removeable joy stick type pry lever tool 27, for effecting the adjustment, simplifies construction of the probe head 11, thereby reducing its cost.

In addition, the single folded leaf spring for providing parallelogram suspension of the contact blade 49, further reduces the cost and complexity of the probe head 11. Moreover, the probe blade 49 incorporating a plurality of contact points 64 and 65 reduces the cost of the blades by prolonging their useful operating life.

What is claimed is:

1. In a probe head means for an automatic semiconductive wafer prober of the type including a probe holder means for holding a plurality of said probe head means in a certain test pattern of positions relative to each other for electrically probing a certain pattern of test points on a semiconductive wafer being tested as the wafer is held to a chuck, and including means for effecting relative movement between the probe holder and the chuck to bring the pattern of probe heads into testing engagement with the pattern of test points on the wafer; the improvement wherein said probe head means includes:

probe body means for coupling to said probe holder means;

testing head means for coupling to said probe body means to be carried from said holder means via the intermediary of said probe body means, and including a probe portion for making electrical contact with a respective test point in the pattern of test points on the semiconductive wafer being tested;

first adjustment means for effecting first relative movement between said probe means and said probe holder means in two orthogonal directions in a plane parallel to the surface of the wafer being tested to obtain a horizontal adjustment of the relative position of said probe portion in the certain test pattern;

second adjustment means for effecting relative movement between said testing head means and said probe body means in a direction generally perpendicular to the plane of the surface of the wafer being tested, to obtain a vertical adjustment of the relative position of said probe portion in the certain test pattern, such vertical adjustment being independent of said horizontal adjustment;

way means operatively associated with said testing head means and probe body means for guiding movement of said testing head means relative to said probe body means; and said way means including a spring clip having a spring biased channel portion formed therein to define said way means for slideably receiving one of said probe body means and said testing head means, and means for fixedly securing said spring clip means to the other one of said probe body means and said testing head means.

2. The apparatus of claim 1 wherein said first adjustment means includes a removeably pry means for manual use by the operator for prying said probe body means relative to said probe holder means to effect said horizontal adjustment.

3. The apparatus of claim 1 wherein said second adjustment means includes a removeable pry means for manual use by the operator for prying said testing head means relative to said probe body means to effect said vertical adjustment.

4. The apparatus of claim 1 wherein said probe portion comprises a blade having a plurality of points thereon for contacting the test points on the wafer such that rotation of the blade between points moves a new oint of said blade into position for probing the test points on the wafer under test.

* * * * *